(12) United States Patent
Seo

(10) Patent No.: US 7,579,664 B2
(45) Date of Patent: Aug. 25, 2009

(54) SEMICONDUCTOR DEVICE WITH TRENCH TYPE DEVICE ISOLATION LAYER AND METHOD FOR FABRICATING THE SAME

(75) Inventor: Dae-Young Seo, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/123,189

(22) Filed: May 6, 2005

(65) Prior Publication Data
US 2006/0022299 A1 Feb. 2, 2006

(30) Foreign Application Priority Data
Jul. 30, 2004 (KR) .................... 10-2004-0060262

(51) Int. Cl.
*H01L 21/76* (2006.01)
(52) U.S. Cl. .................. 257/435; 438/221; 438/296; 438/359; 257/E21.546
(58) Field of Classification Search ......... 438/221–224, 438/359–363, 296, 424–428, 435; 257/510, 257/E21.546
See application file for complete search history.

(56) References Cited
U.S. PATENT DOCUMENTS
6,146,970 A * 11/2000 Witek et al. ................. 438/424
6,613,645 B2 * 9/2003 Fukaura ..................... 438/424
2003/0006476 A1 * 1/2003 Chen et al. .................. 257/510
2003/0011044 A1 * 1/2003 Oh et al. ..................... 257/566
2003/0077891 A1 * 4/2003 Drynan ...................... 438/618
2004/0070023 A1 * 4/2004 Kim et al. ................... 257/315
2004/0235257 A1 * 11/2004 Johansson et al. ........... 438/379
2005/0277261 A1 * 12/2005 Jung ........................... 438/413

FOREIGN PATENT DOCUMENTS
JP 09-252049 9/1997
KR 10-2004-0059394 5/2004
KR 10-2006-0000581 6/2006

* cited by examiner

*Primary Examiner*—Phat X Cao
*Assistant Examiner*—Abul Kalam
(74) *Attorney, Agent, or Firm*—Finnegan, Henderson, Farabow, Garrett & Dunner, L.L.P.

(57) ABSTRACT

Disclosed are a semiconductor device with a device isolation structure and a method for fabricating the same. The method includes the steps of: forming a plurality of trenches defining first active regions by etching a substrate in a predetermined depth; forming a plurality of first device isolation layers in inner sides of the plurality of trenches; forming a plurality of second device isolation layers on the plurality of first device isolation layers as remaining a space opening an upper portion of each first active region disposed between the second device isolation layers; and forming a plurality of second active regions connected to the first active region between the second device isolation layers.

10 Claims, 7 Drawing Sheets

SEMICONDUCTOR DEVICE WITH TRENCH TYPE DEVICE ISOLATION LAYER AND METHOD FOR FABRICATING THE SAME

FIELD OF THE INVENTION

The present invention relates to a technology of fabricating a semiconductor device; and more particularly, to a device isolation structure of a semiconductor device and a method for fabricating the same.

DESCRIPTION OF RELATED ARTS

In general, a device isolation (ISO) process of a semiconductor device forms a field insulation layer in predetermined portions of a semiconductor device by using a typical device isolation method such as a local oxidation of silicon (LOCOS) method or a profiled grove isolation (PGI) method, thereby forming a field region determining an active region.

Among the device isolation methods, the LOCOS method forms a nitride layer which is a mask that determines an active region on a substrate and then, exposes predetermined portions of the substrate by patterning the nitride layer through a photolithography process. Afterwards, a field oxide layer used as a device isolation region is formed by oxidizing the exposed surface of the substrate.

The LOCOS method is advantageous in that the isolation can be achieved through a simple process and a wide portion and a narrow portion can be isolated at the same time. However, the LOCOS method produces a bird's beak by oxidizing lateral sides of the exposed portions of the substrate. As a result, a width of the device isolation region gets wide, thereby decreasing an effective area of source/drain regions. Furthermore, during forming the field oxide layer, stress is centralized around edges of the field oxide layer due to a difference in heat expansion coefficients. Accordingly, a crystal defect is generated on the silicon substrate, thereby generating a lot of leakage current.

Recently, as an integration scale of a semiconductor device has increased, a design rule has conversely decreased. Accordingly, the device isolation layer isolating one device from another device has shrunken as much as the same integration scale that the semiconductor device has decreased. Thus, the typical device isolation method such as the LOCOS method or the PBL method has reached a limitation in the application.

A shallow trench isolation (STI) method is applied to solve the above mentioned problems of the typical device isolation method. The STI method forms a nitride layer having a good etch selectivity with respect to a substrate on the substrate and then, forms a nitride pattern by patterning the nitride layer through a photolithography process, so that the nitride pattern can be used as a hard mask. Afterwards, the substrate is patterned through a dry etching process in a predetermined depth by using the nitride pattern as the hard mask, thereby forming a trench. Thereafter, the trench is filled with an insulation layer with a good gap-fill characteristic and then, a chemical mechanical polishing (CMP) process is performed, thereby forming a device isolation layer.

FIGS. 1A to 1D are cross-sectional views briefly illustrating a conventional device isolation method.

As shown in FIG. 1A, a pad oxide layer 12 and a pad nitride layer 13 are stacked on a substrate 11 and then, a photoresist pattern 14 defining device isolation regions is formed on the pad nitride layer 13.

Subsequently, the pad oxide layer 12 and the pad nitride layer 13 are etched by using the photoresist pattern 14 as an etch barrier, thereby exposing predetermined portions of the substrate 11 for forming the device isolation regions.

As shown in FIG. 1B, the photoresist pattern 14 is removed. Afterwards, the exposed portions of the substrate 11 is etched in a predetermined depth by using the pad nitride layer 13 as a hard mask, thereby forming a plurality of trenches 15 for forming the device isolation regions. Due to the formation of the plurality of trenches 15, unexposed portions of the substrate 11 excluding the plurality of trenches 15 serve a role as active regions 11A.

As shown in FIG. 1C, until the plurality of trenches 15 are completely filled, a device isolation insulation layer 16 is deposited on an upper portion of the pad nitride layer 13. At this time, the device isolation insulation layer 16 is an oxide layer formed through a high density plasma method.

As shown in FIG. 1D, the device isolation insulation layer 16 is planarized by employing a CMP process with use of the pad nitride layer 13 as a polishing stop layer.

Subsequently, the pad oxide layer 12 and the pad nitride layer 13 are selectively removed, thereby completing the device isolation process. That is, a device isolation layer 16A filled into the plurality of trenches 15 is formed.

The aforementioned conventional device isolation method selects the above described STI process leading the device isolation layer 16A to be filled into the plurality of trenches 15.

Recently, as a dynamic random access memory (DRAM) device has been scaled down, a spacing distance between devices has decreased whereas and an aspect ratio of a trench has increased.

However, although the device isolation is carried out by using the STI process, a spacing distance S between the active regions 11A has decreased and thus, there are a lot of difficulties in controlling a leakage current problem between the devices. Due to the aforementioned leakage current problem, refresh time of the DRAM gets shortened.

Furthermore, the conventional device isolation method cannot avoid a problem of generating a void due to a high aspect ratio during the deposition of the device isolation insulation layer 16 filled into the plurality of trenches 15. This void may induce a defect in the polishing by stopping the polishing activity during the CMP process. Also, there may be another problem that the void blocks the device isolation insulation layer from acting as an intended device isolation layer.

SUMMARY OF THE INVENTION

It is, therefore, an object of the present invention to provide a semiconductor device preventing a leakage current problem as a spacing distance between devices has decreased and a void generation due to a high aspect ratio and a method for fabricating the same.

In accordance with one aspect of the present invention, there is provided a semiconductor device, including: a substrate; a plurality of trenches defining first active regions formed in predetermined portions of the substrate; a plurality of first device isolation layers each filled into the corresponding trench; a plurality of second device isolation layers each formed on the corresponding first device isolation layer; and a plurality of second active regions each formed on the corresponding first active region by being filled into a space between the second device isolation layers.

In accordance with another aspect of the present invention, there is provided a method for fabricating a semiconductor device with a device isolation structure for device isolation, including the steps of: forming a plurality of trenches defining first active regions by etching a substrate in a predetermined depth; forming a plurality of first device isolation layers in inner sides of the plurality of trenches; forming a plurality of second device isolation layers on the plurality of first device isolation layers as remaining a space opening an upper portion of each first active region disposed between the second device isolation layers; and forming a plurality of second active regions connected to the first active region between the second device isolation layers.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions of preferred embodiments of the present invention will be provided with reference to the accompanying drawings.

The preferred embodiment of the present invention to be explained hereinafter forms a device isolation layer as a dual structure including a first device isolation layer and a second device isolation layer as well as an active region as a dual structure including a first active region and a second active region.

Figure 1A:
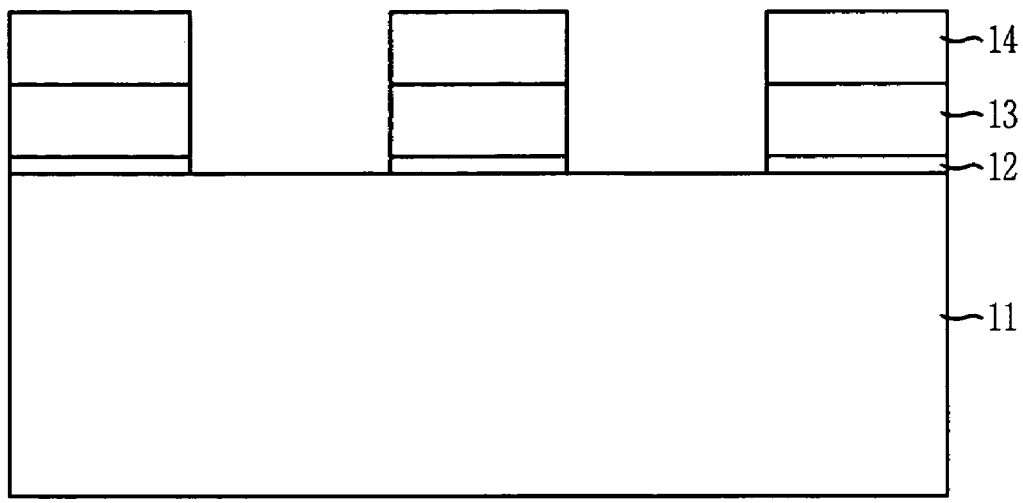
FIGS. 1A to 1D are cross-sectional views briefly illustrating a conventional device isolation method in a semiconductor device.
Figure 1B:
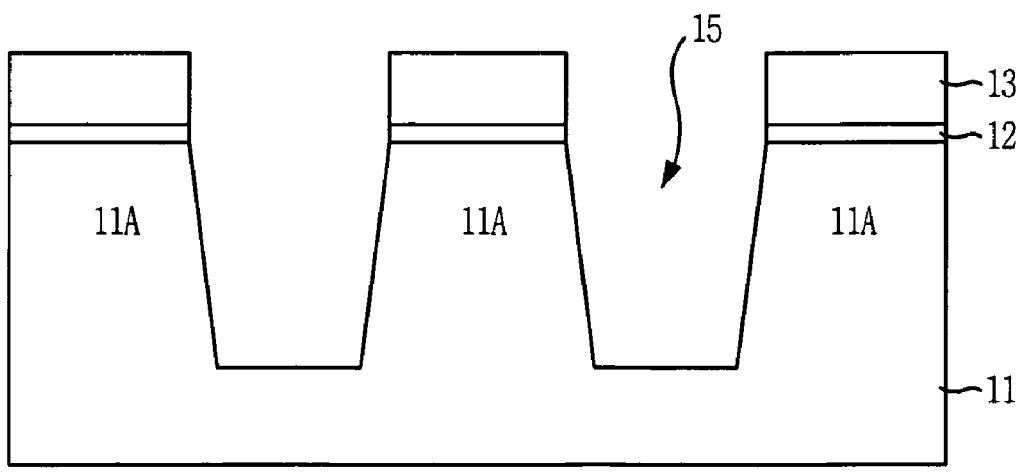
Figure 1C:
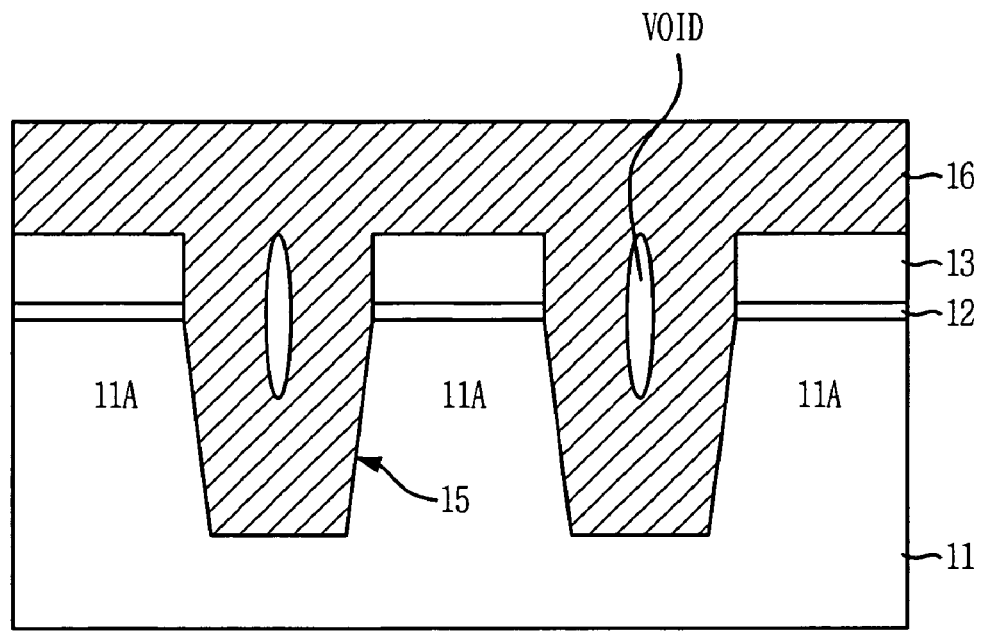
Figure 1D:
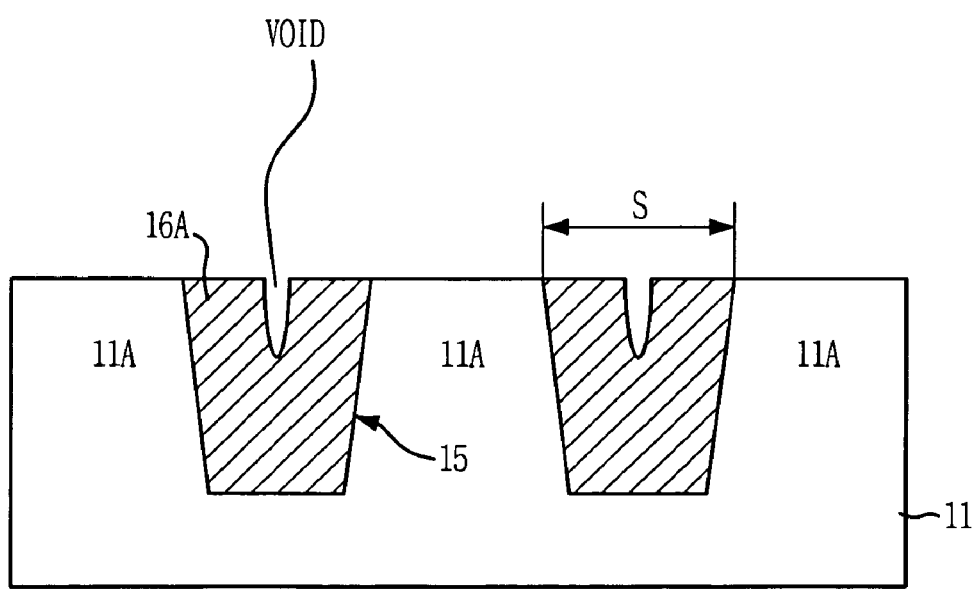
Figure 2:
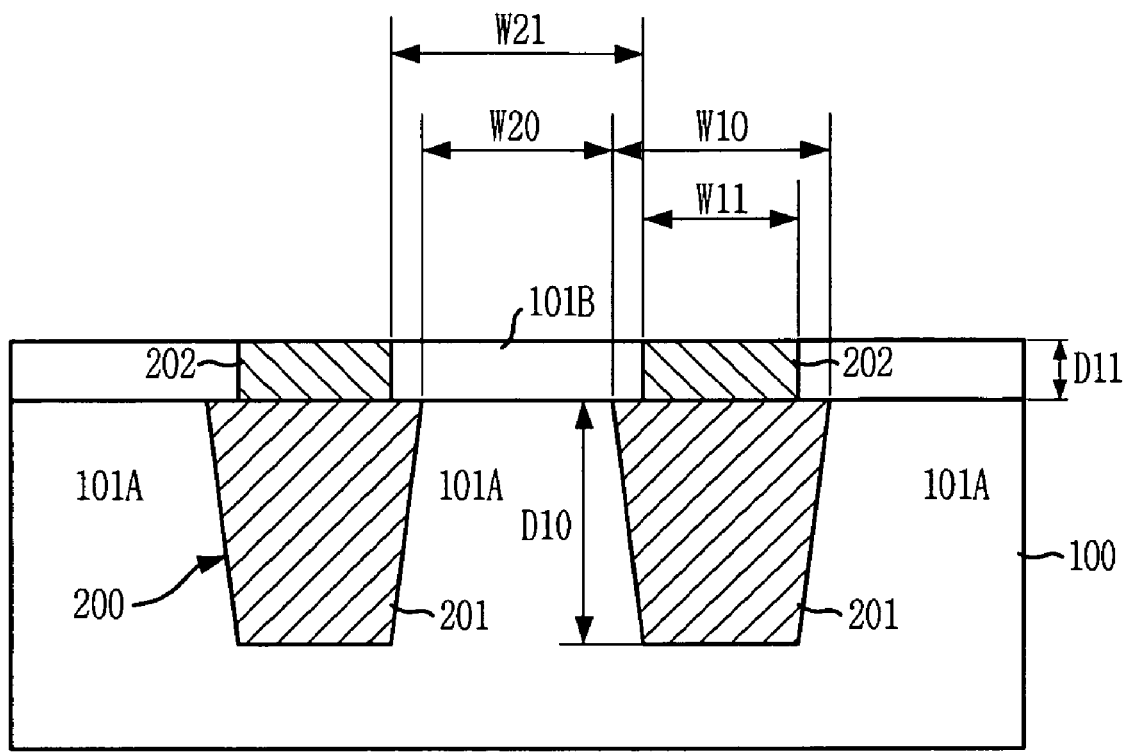
FIG. 2 is a cross-sectional view illustrating a device isolation structure of a semiconductor device in accordance with the present invention.

FIG. 2 is a cross-sectional view illustrating a device isolation structure of a semiconductor device in accordance with the preferred embodiment of the present invention.

As shown in FIG. 2, the device isolation structure includes: a substrate 100; a plurality of trenches 200 defining first active regions 101A each formed in a predetermined portion of the substrate 100; a plurality of first device isolation layers 201 individually filled into the plurality of trenches 200; a plurality of second device isolation layers 202 correspondingly formed on the plurality of first device isolation layers 201; and a second active region 101B formed between the two adjacent second device isolation layers 202. Although the single second active region 101B is illustrated in this drawing, a plurality of the second device isolation layers 202 are formed.

In detail, a width W10 of the first device isolation layer 201 filled into the corresponding trench 200 is larger than a width W11 of the second device isolation layer 202. A depth D10 of the first device isolation layer 201 is deeper than a depth D11 of the second device isolation layer 202. Herein, a width and a depth of the trench 200 are larger and thinner than an intended trench, and a target depth and width of the intended trench are satisfied by forming the second device isolation layers 202 correspondingly on the first device isolation layers 201.

Also, a width W20 of the first active region 101A is smaller than a width W21 of the second active region 101B.

Herein, the plurality of first device isolation layers 201 and the plurality of second device isolation layers 202 are made of oxide obtained through a high density plasma method. Unlike the first active regions 101A formed with the same material for the substrate 11, the second active region 101B is an epitaxial silicon layer grown through a selective epitaxial growth (SEG) method.

As shown in FIG. 2, the device isolation layer is formed in a dual structure including the first device isolation layer 201 and the second device isolation layer 202. The active region is also formed in a dual structure including the first active region 101A and the second active region 101B. Thus, a leakage current property between neighboring devices is improved.

Unlike the conventional formation of a device isolation layer by filling a plurality of trenches having a high aspect ratio at once, the plurality of first device isolation layer 201 are filled into the plurality of trenches 200 having a reduced aspect ratio and thus, a void is not generated. Furthermore, the plurality of second device isolation layers 202 are formed on the plurality of first device isolation layers 201 and thus, a sufficient depth required for the device isolation is obtained.

Hereinafter, a method for fabricating a semiconductor device having the device isolation structure shown in FIG. 2 is explained.

FIGS. 3A to 3G are cross-sectional views illustrating a method for fabricating a semiconductor device in accordance with the present invention.

Figure 3A:
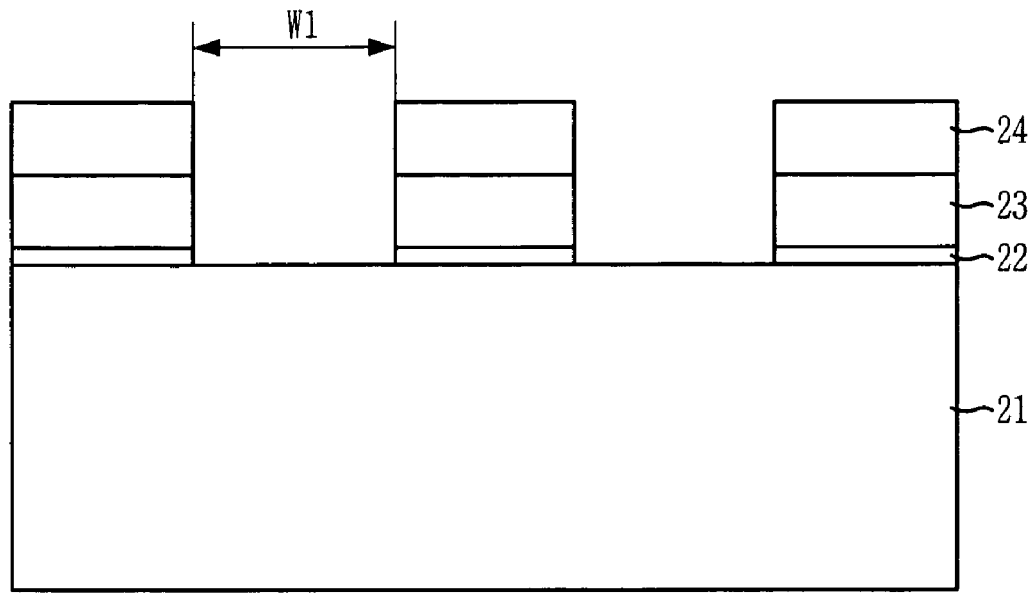
FIGS. 3A to 3G are cross-sectional views illustrating a method for fabricating a semiconductor device in accordance with the present invention.

As shown in FIG. 3A, a pad oxide layer 22 and a pad nitride layer 23 are deposited on a substrate 21. At this time, the pad nitride layer 23 serves a role as a hard mask during etching a subsequent trench and the pad oxide layer 22 serves a role in relieving a stress that the substrate receives from depositing the pad nitride layer 23.

Next, a photoresist layer is formed on the pad nitride layer 23 and then, patterned through photo-exposure and developing processes. As a result, a first photoresist pattern 24 defining device isolation regions is formed. After the first photoresist pattern 24 is formed, the pad oxide layer 22 and the pad nitride layer 23 are etched by using the first photoresist pattern 24 as an etch barrier, thereby exposing predetermined portions of the substrate 21 for forming the device isolation regions.

A width W1 of an opening between the first photoresist patterns 24 is identical to a width of the subsequent trench but larger than a width of an intended trench.

Figure 3B:
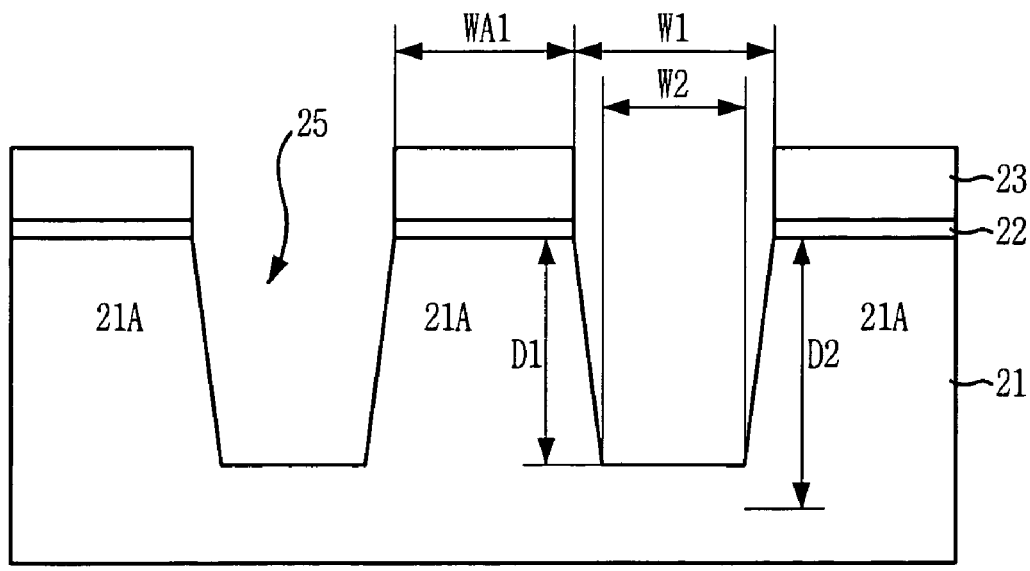

As shown in FIG. 3B, the first photoresist pattern 24 is removed and then, the substrate 21 exposed by using the pad nitride layer 23 as the etch barrier is etched in a predetermined depth. As a result, a plurality of trenches 25 for forming the device isolation regions are formed.

At this time, a width W1 of the individual trench 25 is larger than a width W2 of the intended trench, and a depth D1 of the individual trench 25 is smaller than a depth D2 of the intended trench. For instance, the depth D1 of the trench 25 is decreased by approximately 100 Å to approximately 2,000 Å from the depth D2 of the intended trench, and the width W1 of the trench 25 is increased by approximately 100 Å to approximately 200 Å from the width W2 of the intended trench.

Particularly, the width W1 of the individual trench 25 is formed larger than a width of the intended device isolation region and thus, the width W1 of the individual trench 25 can be adjusted during the formation of the first photoresist pattern 24.

If the width W1 of the individual trench 25 is increased, a width WA1 of each first active region 21A defined between the two neighboring trenches 25 becomes smaller than a width of an intended active region; however, an isolation distance between the devices gets increased as much as a difference between the width W1 of the individual trench 25 and the width W2 of the intended trench.

If the depth D1 of the individual trench 25 gets thinner, an aspect ratio of the individual trench 25 can be reduced. For instance, if the width W2 and the depth D2 of the intended trench are approximately 10 Å and approximately 50 Å, respectively, an aspect ratio of the intended trench is approximately 1 to 5. If the width W1 and the depth D1 of the trench are approximately 15 Å and approximately 45 Å, respectively, an aspect ratio of the individual trench is approximately 1 to approximately 3.

As described above, the aspect ratio of the individual trench 25 is substantially decreased compared with the aspect ratio of the intended trench.

Meanwhile, thicknesses of the pad oxide layer 22 and the pad nitride layer 23 are not considered for the decreasing effect in the aspect ratio of the trench 25. Practically, during filling the plurality of trenches 25, the aspect ratio can be influenced by the thicknesses of the pad nitride layer 23 and the pad oxide layer 22; however, the aspect ratio of the intended trench is also influenced by the thicknesses of the pad nitride layer 23 and the pad oxide layer 22. Therefore, the aspect ratio due to the pad oxide layer 22 and the pad nitride layer 23 is not taken into account herein.

Figure 3C:
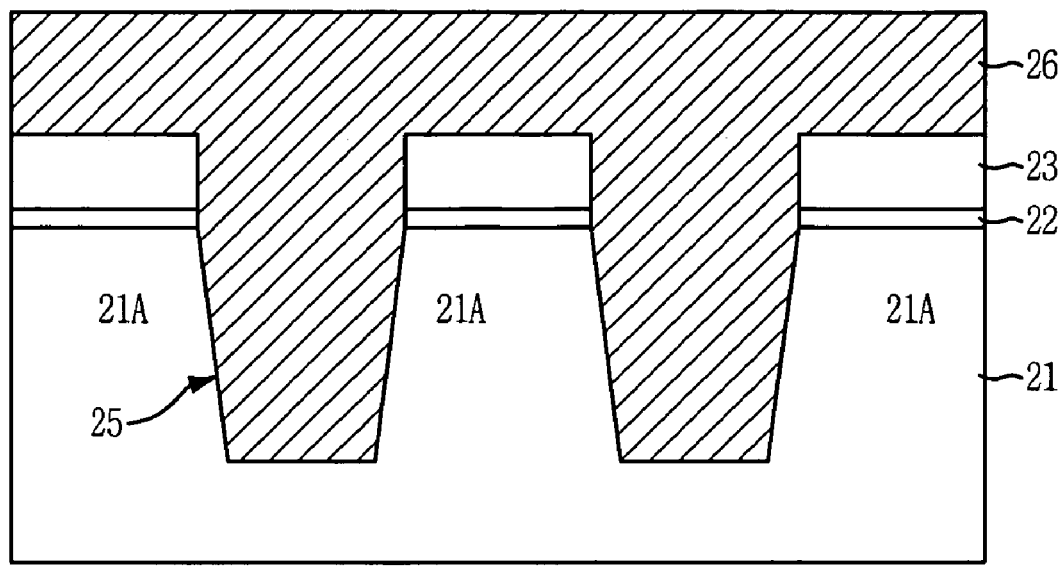

As shown in FIG. 3C, until the plurality of trenches 25 are completely filled, a first device isolation insulation layer 26 is formed on the pad nitride layer 23. At this time, since the first device isolation insulation layer 26 is filled into the plurality of trenches 25 having a reduced aspect ratio compared with the intended trench, it is possible to form the first device isolation insulation layer 26 without generating a void.

The first device isolation insulation layer 26 is made of oxide with a good gap-fill property obtained through a high density plasma method. Since the first device isolation insulation layer 26 has the reduced aspect ratio, it is possible to sufficiently secure a gap-fill margin during the formation of the oxide through the high density plasma method.

Figure 3D:
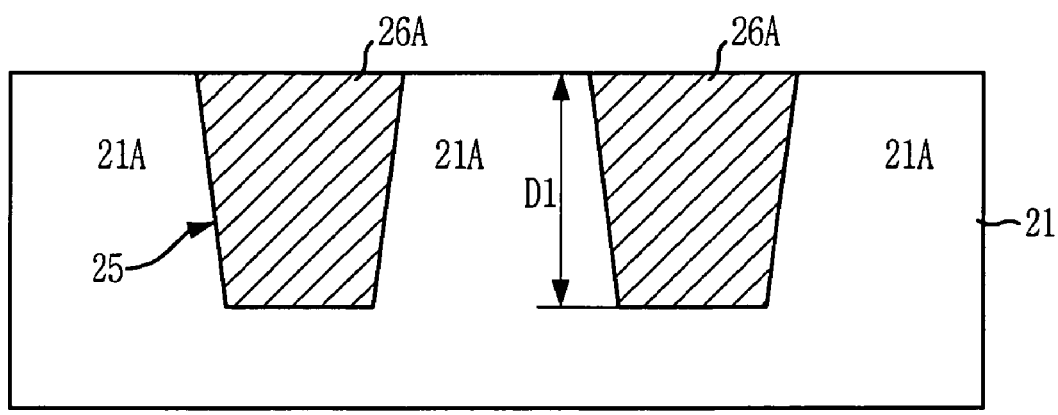

As shown in FIG. 3D, the first device isolation insulation layer 26 is planarized by using a chemical mechanical polishing (CMP) process with use of the pad nitride layer 23 as a polishing stop layer. Next, the pad nitride layer 23 and the pad oxide layer 22 are selectively removed. At this time, during performing the CMP process, some portions of the pad nitride layer 23 are polished and as a result, a thickness of the pad nitride layer 23 gets thinner. The thinner pad nitride layer 23 is removed by using a solution of phosphoric acid ($H_3PO_4$). The pad oxide layer 22 is removed by using a solution of hydrogen fluoride (HF).

After the CMP process is performed and the pad nitride layer 23 and the pad oxide layer 22 are removed, a plurality of first device isolation layers 26A are formed in the inner sides of the plurality of trenches 25. The plurality of first device isolation layers 26A are formed by that certain portions of the first device isolation insulation layer 26 are removed during the removal of the pad oxide layer 22. As a result, there is almost not a height difference between the individual active region 21A and the individual first device isolation layer 26A.

Figure 3E:
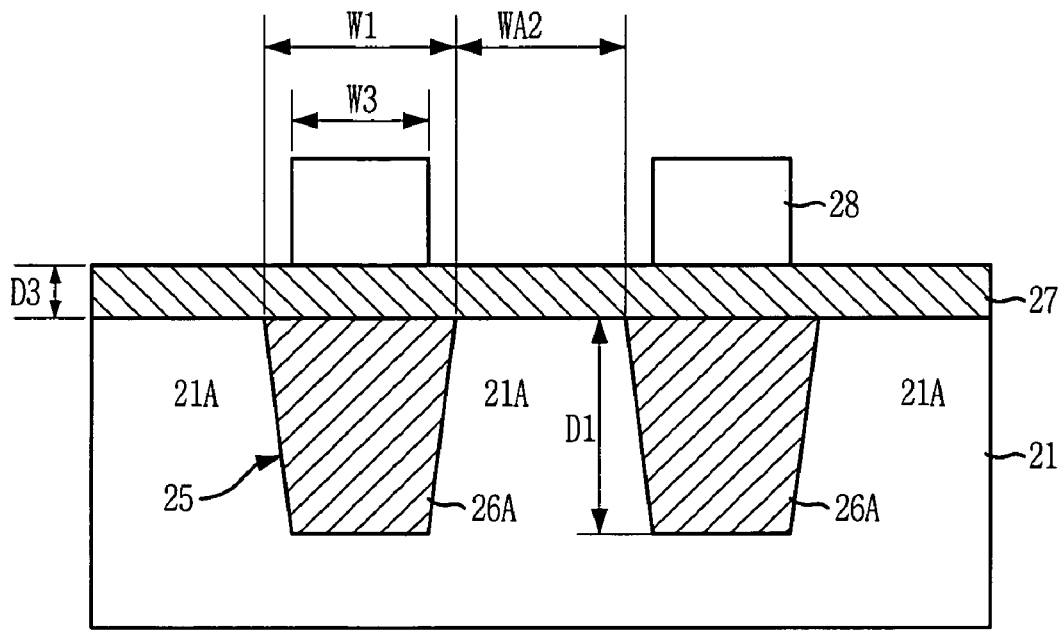

As shown in FIG. 3E, a second device isolation insulation layer 27 is formed on the above resulting. At this time, the second device isolation layer 27 is made of oxide obtained through a high density plasma method and has a depth of D3. Herein, the depth D3 of the second device isolation insulation layer 27 is added to the depth D1 of the individual trench 25, thereby sufficiently satisfying the depth D2 of the intended trench. Accordingly, the depth D3 of the second device isolation layer 27 ranges from approximately 100 Å to approximately 2,000 Å to compensate the depth D1 of the individual trench 25 that has become thinner.

Furthermore, the second device isolation layer 27 is not filled into the plurality of trenches, but is formed on a planarized bottom structure. As a result, it is possible to form the second device isolation layer 27 without generating a void, thereby increasing the depth D3 of the second device isolation layer 27 thicker.

Next, a photoresist layer is deposited on the second device isolation insulation layer 27 and patterned through photo-exposure and developing processes, thereby forming a second photoresist pattern 28. At this time, the second photoresist pattern 28 covers the first device isolation layer 26A; however, the second photoresist pattern 28 has a smaller width W3 than the width W1 of the first device isolation layer 26A. That is, the aforementioned photo-exposure and developing processes are performed to the second photoresist pattern 28 contrary to the photo-exposure and developing processes performed to the first photoresist pattern 24 shown in FIG. 2A. The above photo-exposure and developing processes applied to the second photoresist pattern 28 are referred as a reverse mask process.

Accordingly, a width WA2 of an opening between the second photoresist patterns 28 becomes a width of a second active region and will be explained in detail later.

Figure 3F:
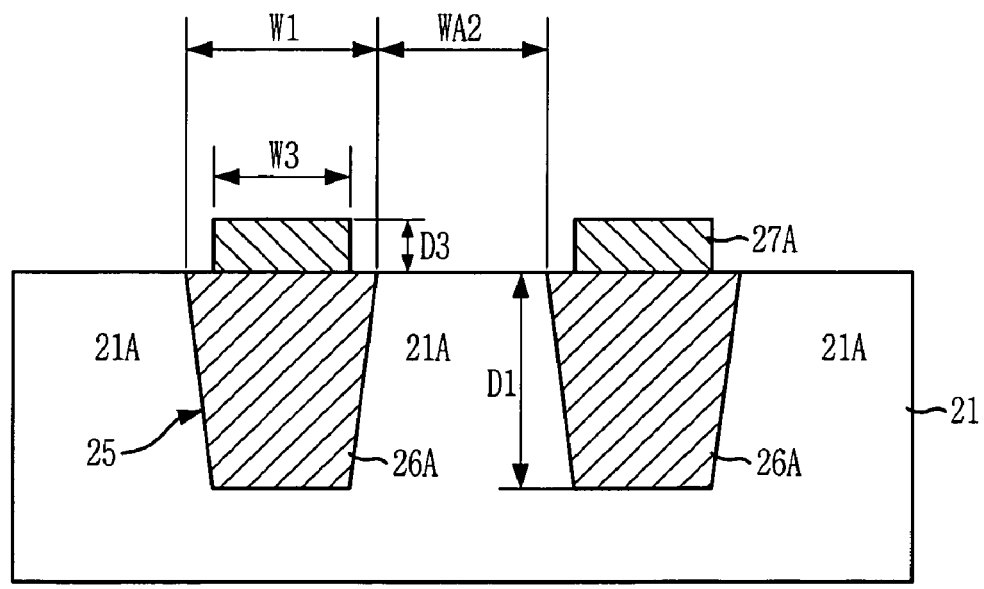

As shown in FIG. 3F, the second device isolation insulation layer 27 is etched by using the second photoresist pattern 28 as an etch mask. Through this etching process, a plurality of second device isolation layers 27A are formed on the plurality of first device isolation layers 26A. At this time, the plurality of second device isolation layers 27A are spaced out in a predetermined distance WA2 which will be defined as a width of the second active region. Afterwards, the second photoresist pattern 28 is removed.

The plurality of second device isolation layers 27A remaining after the second photoresist pattern 28 is removed are formed on the plurality of first device isolation layers 26A with a width of W3 and a depth of D3 which is determined by the depth D3 of the second device isolation layer 27A. At this time, the width W3 of the second device isolation layer 27A is smaller than the width W1 of the first device isolation layer 26A and the depth D3 of the second device isolation layer 27A is thinner than the depth D1 of the first device isolation layer 26A.

As described above, the present invention forms the device isolation layer in a vertical structure by sequentially forming the first device isolation layer 26A and the second device isolation layer 27A. Although the second device isolation insulation layer 27 supposed to be the second device isolation layer 27A is very thickly formed without a limitation in the thickness, the void is not generated. As a result, the thickness of the second device isolation layer 27A can be formed very thickly.

Accordingly, the device isolation layer of the present invention can be formed to have a thickness enough to isolate the devices that can sufficiently prevent a leakage current problem arising between neighboring devices. Furthermore, the first device isolation insulation layer 26 supposed to be the first device isolation layer 26A is filled into the plurality of trenches 25 having the reduced aspect ratio and thus, it is possible to form the second device isolation insulation layer 27 without generating the void.

Figure 3G:
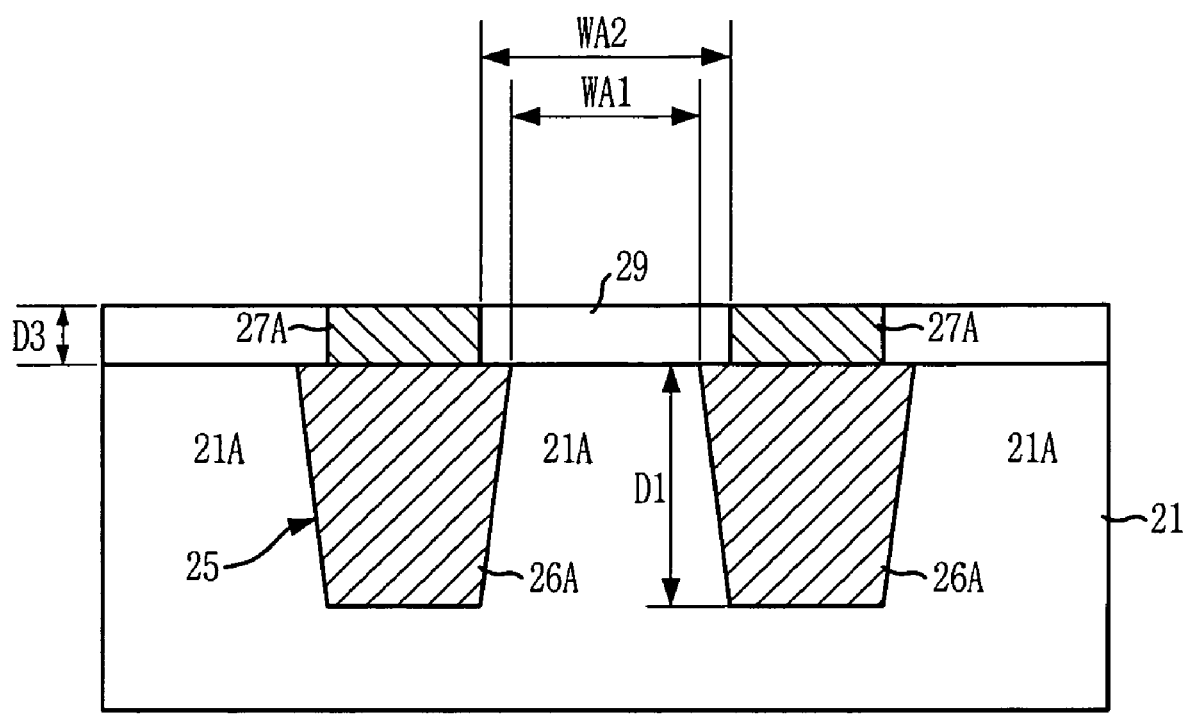

As shown in FIG. 3G, a second active region 29 is formed on a surface of the first active region 21A exposed between the second device isolation layers 27A. At this time, the second active region 29 is made of an epitaxial silicon layer grown through a selective epitaxial growth (SEG) process. Since the SEG process has a lateral growth characteristic, the epitaxial silicon layer is grown on the lateral sides as well as on the surface of the first active region 21A. As a result, the epitaxial silicon layer is grown on an upper portion of the first device isolation layer 26A.

The width WA2 of the second active region 29 is relatively larger than the width WA1 of the first active region 21A and thus, an area of the second active region 29 is larger. As described above, the second active region 29 with the larger width WA2 is formed on the first active region 21A with the smaller width WA1. This dual structure gives rise to a T-type active region. As a result, there is an effect of preventing the leakage current problem between the neighboring devices.

The present invention forms the device isolation layer with the dual structure by stacking the first device isolation layer 26A and the second device isolation layer 27A and the active region in a T-type structure by forming the second active region 29 on the first active region 21A. Accordingly, it is possible to prevent the leakage current problem between the neighboring devices.

Unlike the formation of the device isolation layer by filling a trench with a large aspect ratio at once according to the present invention, the first device isolation layer 26A is filled into the trench 25 with the reduced aspect ratio. Accordingly, the void is not generated. Furthermore, since the second device isolation layer 27A is formed on the first device isolation layer 26A, a desired depth for the device isolation can be sufficiently achieved.

As described above, a dual structure of the device isolation layer including the first device isolation layer filled into the trench and the second device isolation layer formed on the first device isolation layer provides an effect of preventing void generation in the device isolation layer.

Also, a dual structure of the active region including the first active region with a larger width and the second active region with a smaller width formed on the first active region provides another effect of preventing a leakage current problem between neighboring devices.

The present application contains subject matter related to the Korean patent application No. KR 2004-0060262, filed in the Korean Patent Office on Jul. 30, 2004 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device with a device isolation structure for device isolation, the method comprising:
    forming a plurality of trenches defining first active regions by etching a substrate in a predetermined depth;
    filling a plurality of first device isolation layers in the plurality of trenches;
    planarizing the plurality of first device isolation layers, wherein each of the first device isolation layers has a top surface which is level with a top surface of the first active regions;
    forming a device isolation insulation layer on the first device isolation layers and the first active regions;
    forming a plurality of second device isolation layers on the plurality of first device isolation layers by removing portions of the device isolation insulation layer on the first active regions, wherein the second device isolation layers are formed narrower than the first device isolation layers; and
    forming a plurality of second active regions between the second device isolation layers on the first active regions.

2. The method of claim 1, wherein the second device isolation layers have a depth of approximately 100 Å to approximately 2,000 Å.

3. The method of claim 1, wherein forming the plurality of second device isolation layers includes:
    depositing a photoresist layer on the device isolation insulation layer;
    forming a photoresist pattern covering upper portions of the first device isolation layers by patterning the photoresist layer through photo-exposure and developing processes;
    removing the portions of the device isolation insulation layer on the first active regions with use of the photoresist pattern as an etch mask, thereby forming the plurality of second device isolation layers; and
    removing the photoresist pattern.

4. The method of claim 1, wherein a width of the first device isolation layers is larger than a width of the second device isolation layers and a depth of the first device isolation layers is larger than a depth of the second device isolation layers.

5. The method of claim 3, wherein a width of the first device isolation layers is larger than a width of the second device isolation layers and a depth of the first device isolation layers is larger than a depth of the second device isolation layers.

6. The method of claim 1, wherein the first device isolation layers and the second device isolation layers are made of oxide obtained through a high density plasma method.

7. The method of claim 3, wherein the first device isolation layers and the second device isolation layers are made of oxide obtained through a high density plasma method.

8. The method of claim 1, wherein the second active regions include epitaxial silicon layers formed through a selective epitaxial growth (SEG) process.

9. The method of claim 1, wherein planarizing the plurality of first device isolation layers includes performing a CMP process.

10. The method of claim 2, wherein each of the second device isolation layers has a depth ranging from approximately 100 Å to approximately 2,000 Å.

* * * * *